United States Patent
Luo et al.

(10) Patent No.: US 7,053,354 B1
(45) Date of Patent: May 30, 2006

(54) METHOD FOR REDUCING DARK CURRENT FOR AN ARRAY OF ACTIVE PIXEL SENSOR CELLS

(75) Inventors: Qiang Luo, Santa Clara, CA (US); Eric Staton, San Francisco, CA (US); Christina Phan, San Jose, CA (US); Caron Yvonne Thor, San Jose, CA (US); Edith Kwong, San Francisco, CA (US); Chris Papalias, Emerald Hills, CA (US)

(73) Assignee: Eastman Kodak Company, Rochester, NY (US)

( * ) Notice: Subject to any disclaimer, the term of this patent is extended or adjusted under 35 U.S.C. 154(b) by 124 days.

(21) Appl. No.: 10/853,806

(22) Filed: May 24, 2004

(51) Int. Cl.
*H01L 27/00* (2006.01)

(52) U.S. Cl. .................... 250/208.1; 348/297
(58) Field of Classification Search ............ 250/214 R, 250/208.1; 348/307, 308, 310, 297
See application file for complete search history.

(56) References Cited

U.S. PATENT DOCUMENTS

| 5,841,158 A | 11/1998 | Merrill | 257/233 |
| 5,841,176 A | 11/1998 | Merrill | 257/446 |
| 6,307,195 B1 * | 10/2001 | Guidash | 250/208.1 |
| 6,348,681 B1 * | 2/2002 | Kindt et al. | 250/208.1 |
| 6,462,365 B1 | 10/2002 | He et al. | 257/292 |
| 6,498,331 B1 | 12/2002 | Kozlowski et al. | 250/208.1 |
| 6,548,363 B1 | 4/2003 | Wu et al. | 438/305 |
| 6,621,064 B1 | 9/2003 | Chen et al. | 250/214.1 |
| 6,906,304 B1 * | 6/2005 | Knee et al. | 250/208.1 |
| 2004/0036008 A1 * | 2/2004 | Barna | 250/208.1 |

OTHER PUBLICATIONS

U.S. Appl. No. 10/786,846, filed Feb. 25, 2004, Luo.
Ikuko Inoue et al., "Low-Leakage-Current and Low-Operating-Voltage Buried Photodiode for a CMOS Imager", IEEE Transactions on Electron Devices, vol. 50, No. 1, Jan. 2003, pp. 43-47.
Hsiu-Yu and Ya-Chin King, "An Ultra-Low Dark Current CMOS Imager Sensor Cell Using n+ Ring Reset", IEEE Electron Device Letters, vol. 23, No. 9, Sep. 2002, pp. 538-540.

* cited by examiner

Primary Examiner—Stephone B. Allen
Assistant Examiner—Suezu Ellis
(74) Attorney, Agent, or Firm—Peyton C. Watkins

(57) ABSTRACT

An array of active pixel sensor cells is operated to substantially reduce the gate induced drain leakage (GIDL) current component of the dark current. In addition, the array is tested to determine the number of cells in the array that are bad, and discards the array of active pixel sensor cells when the number of bad cells exceeds a predefined limit.

17 Claims, 3 Drawing Sheets

US 7,053,354 B1

METHOD FOR REDUCING DARK CURRENT FOR AN ARRAY OF ACTIVE PIXEL SENSOR CELLS

BACKGROUND OF THE INVENTION

1. Field of the Invention

The present invention relates to imaging cells and, more particularly, to a method of operating an array of active pixel sensor cells.

2. Description of the Related Art

Traditional film-based cameras are rapidly being replaced by digital cameras that utilize a large number of imaging cells to convert the light energy received from an image into electric signals that represent the image. One type of imaging cell that is used in digital cameras to capture the light energy from an image is an active pixel sensor cell.

FIG. 1 shows a diagram that illustrates a prior-art imaging circuit 100. As shown in FIG. 1, imaging circuit 100 includes an active pixel sensor cell 110 that has an n+/p– photodiode 112 and an n-channel reset transistor 114. The p– region of n+/p– photodiode 112 is connected to ground.

Reset transistor 114 has spaced-apart n-type source and drain regions 114A and 114B that are formed in a p-type material 114C. Source region 114A, which has an n+ region and an n-type lightly-doped source (nlds) region, is connected to the n+ region of photodiode 112, while drain region 114B, which has an n+ region and an n-type lightly-doped drain (nldd) region, is connected to a supply voltage VCC.

In addition, a channel region of p– material 114C is located between and contacts source and drain regions 114A and 114B. Further, reset transistor 114 includes a layer of dielectric material 114D, such as gate oxide, that lies over the channel region, and a gate 114E that is formed on dielectric layer 114D over the channel region to receive a reset pulse.

In addition, active pixel sensor cell 110 also includes an n-channel source-follower transistor 116 that has a drain connected to the supply voltage VCC, and a gate that is connected to the n+ region of photodiode 112 and source 114A of reset transistor 114. Cell 110 further includes an n-channel row select transistor 118 that has a drain connected to the source of source-follower transistor 116, and a gate connected to receive a select signal.

In addition to active pixel sensor cell 110, imaging circuit 100 also includes a bias circuit 120 that defines a bias current I. Bias circuit 120 includes a first bias transistor 122, a second bias transistor 124, and a current source 126. First bias transistor 122 has a gate, a drain connected to the source of select transistor 118, and a source connected to ground.

Second bias transistor 124 has a drain, a gate connected to the gate of first bias transistor 122, and a source connected to ground. Current source 126, in turn, has an input connected to the supply voltage VCC, and an output connected to the gates of bias transistors 122 and 124, and to the drain of transistor 124.

The operation of imaging circuit 100 is performed in five steps. The initial step of the five is a first reset step where cell 110 is reset by pulsing gate 114E of reset transistor 114 with a reset signal RS for a pulse width PW period of time to place a diode voltage $V_1$, which has a first integration magnitude, on the n+ region of photodiode 112 and the gate of source-follower transistor 116. The first integration magnitude of the diode voltage $V_1$ is equal to the supply voltage VCC less the threshold voltage $V_t$ of reset transistor 114. Further, unless being pulsed by the reset signal RS to, for example, five volts, gate 114E of reset transistor 114 is held at ground.

Alternately, the first integration magnitude of the diode voltage $V_1$ can be equal to the supply voltage VCC when the voltage of the reset signal RS is equal to the supply voltage VCC plus the threshold voltage $V_t$ of reset transistor 114. The alternate approach provides additional dynamic range equal to the threshold voltage $V_t$ of reset transistor 114 at the cost of generating an additional voltage level.

The second step of the five is an integration step where light energy, in the form of photons, strikes photodiode 112, thereby creating a number of electron-hole pairs. Photodiode 112 is designed to limit recombination between the newly formed electron-hole pairs. As a result, the photogenerated holes are attracted to ground via the p– region of photodiode 112, while the photogenerated electrons are attracted to the n+ region of photodiode 112 where each additional electron reduces the magnitude of the diode voltage $V_1$ on the n+ region of photodiode 112. As a result, photodiode 112 converts the light energy into a charge that varies an electrical value.

The third step of the five is a read step where the reduced magnitude of the diode voltage $V_1$ is read from cell 110 at the end of the integration period to determine a second integration magnitude of the diode voltage $V_1$. The second integration magnitude, which is equal to $VCC-V_t-V_S$, where $V_S$ represents the change in voltage due to the absorbed photons, is read by turning on row select transistor 118.

When row select transistor 118 is turned on, the reduced magnitude of the diode voltage $V_1$ on the n+ region of photodiode 112 reduces the magnitude of a second voltage $V_2$ on the source of source-follower transistor 116 which, in turn, places a third voltage $V_3$ on the source of select transistor 118. The third voltage $V_3$ on the source of select transistor 118 is then detected by conventional voltage detectors.

The fourth step of the five is a second reset step where cell 110 is reset by pulsing gate 114E of reset transistor 114 with the reset signal RS to again place the first integration magnitude of the diode voltage $V_1$ on the n+ region of photodiode 112 and the gate of source-follower transistor 116. Ideally, the first integration magnitude of the second reset step is identical to the first integration magnitude of the first reset step, i.e., equal to the supply voltage VCC or the supply voltage VCC less the threshold voltage $V_t$ of reset transistor 114.

The last step of the five is a second read step where the diode voltage $V_1$ is again read from cell 110 to determine the first integration magnitude of the diode voltage $V_1$. The first integration magnitude is read by again turning on row select transistor 118. When row select transistor 118 is turned on, the first integration magnitude of the diode voltage $V_1$ on the n+ region of photodiode 112 sets the magnitude of the second voltage $V_2$ on the source of source-follower transistor 116. This then sets the magnitude of the third voltage $V_3$ on the source of select transistor 118. The first integration magnitude on the source of select transistor 118 is then detected by conventional voltage detectors.

The number of photons which were absorbed by photodiode 112 during the image integration period can then be determined by subtracting the second integration magnitude read at the end of the integration period from the first integration magnitude read following the second reset, thereby yielding the value $V_S$, i.e., $((VCC-V_t)-(VCC-V_t-V_S))$.

Bias circuit 120, in turn, sinks the bias current I through the NMOS transistors 116, 118, and 122. The bias transistors 122 and 124 and current source 126 function as a current mirror, where a voltage $V_4$ on the gates of transistors 122 and 124 sets a common gate-to-source voltage, such that bias current I is proportional to the magnitude of the current sourced by current source 126 (depending on the relative sizes of transistors 122 and 124).

One drawback of active pixel sensor cell 110 is that, when fabricated in a deep submicron process, such as a 0.18-micron process, cell 110 suffers from a substantially large dark current. The dark current is a leakage current that discharges (pulls down) the first integration magnitude of the diode voltage $V_1$ placed on the n+ region of photodiode 112 when no light energy is present at all. In addition, the dark current gets worse as CMOS processes are further scaled down, where the gate oxide layer becomes thinner and the doping concentrations become heavier, due to the increased electric field across the gate oxide layer.

In older processes, such as 0.35-micron and 0.50-micron processes, the dark current was predominantly due to the leakage current across the pn junction of photodiode 112. However, in a deep submicron process, such as a 0.18-micron process, the gate induced drain leakage (GIDL) current of the cell now also becomes a significant component of the dark current.

The GIDL current is a strong drain-to-gate voltage (Vdg) dependent current which results from a high electric field across dielectric layer 114D of reset transistor 114 in the region where gate 114E vertically overlaps drain region 114B. When a high electric field is present, such as when ground is applied to gate 114E and the supply voltage VCC is applied to drain 114B at the beginning of an integration period, a deep depletion region is formed under gate 114E in the gate/drain overlap region which, in turn, generates electrons and holes by band-to-band tunneling at the silicon—silicon dioxide interface. The resulting drain-to-body current, which injects electrons into drain region 114B, forms the GIDL current.

The GIDL current $I_{GIDL}$ is roughly related to the ratio of the gate-to-drain voltage Vgd (Vgd is negative when reset transistor 114 is turned off) to the thickness of the dielectric layer 114D (Tox) and drain-to-body voltage (Vdb) as shown in EQ. 1:

$$I_{GIDL} \propto \frac{-V_{gd}}{T_{ox}} \cdot \exp\left(\frac{T_{ox}}{V_{gd}}\right) \cdot \frac{V_{db}^3}{\alpha + V_{db}^3} \quad \text{EQ. 1}$$

where $\alpha$ represents a constant related to process, and g, d, and b represent the gate, drain, and body, respectively.

Since MOS transistors are symmetrical, a strong source-to-gate Vsg dependent current also results from a high electric field across dielectric layer 114D of reset transistor 114 in the region where gate 114E vertically overlaps source region 114A. As before, when a high electric field is present, such as when ground is applied to gate 114E and the supply voltage VCC (or VCC-$V_{t114}$) is applied to source 114A at the beginning of the integration period, a deep depletion region is formed under gate 114E in the gate/source overlap region which, in turn, generates electrons and holes by band-to-band tunneling at the silicon—silicon dioxide interface. The resulting source-to-body current, which injects electrons into source region 114A, forms a source GIDL current that discharges (pulls down) the first integration magnitude of the diode voltage $V_1$ placed on the n+ region of photodiode 112.

Thus, when active pixel sensor cell 110 is exposed to the light energy from an image during an integration period, the first integration magnitude of diode voltage $V_1$ placed on the n+ region of photodiode 112 falls in response to both the received light energy as well as the dark current, which includes a photodiode leakage component and a source GIDL component.

When the overall dark current is high, the minimum voltage that can be obtained increases which, in turn, reduces the dynamic range of cell 110. When the overall dark current is excessively high due to a large source GIDL current component, cell 110 can saturate before the end of the integration period which, in turn, renders the cell useless (bad). An active pixel sensor cell saturates when the combination of light energy and dark current pull the voltage on the n+ region of photodiode 112 down to ground before the image integration period has ended.

When an array of active pixel sensor cells is formed, the layer of dielectric material used with all of the reset transistors in the array, such as dielectric layer 114D, is formed at the same time to have a uniform thickness. Although formed to have a uniform thickness, even the most exacting fabrication processes produce a variation in the thickness of the dielectric layer, with some regions thicker and other regions thinner.

However, thinner regions of the dielectric layer intensify the effect of the electric field which, in turn, intensifies the effect of the source GIDL component of the dark current. In some cases, the source GIDL component, along with the intensified effect from the thinner regions of the dielectric material, cause significant numbers of the cells in the array to saturate before the integration period has ended.

These saturated active pixel sensor cells, which are bad, appear as white dots in the resulting image, and seriously effect the quality of the resulting image. As a result, there is a need for a deep-submicron active pixel sensor cell that substantially reduces the magnitude of the dark current.

DETAILED DESCRIPTION OF THE INVENTION

Figure 2A:
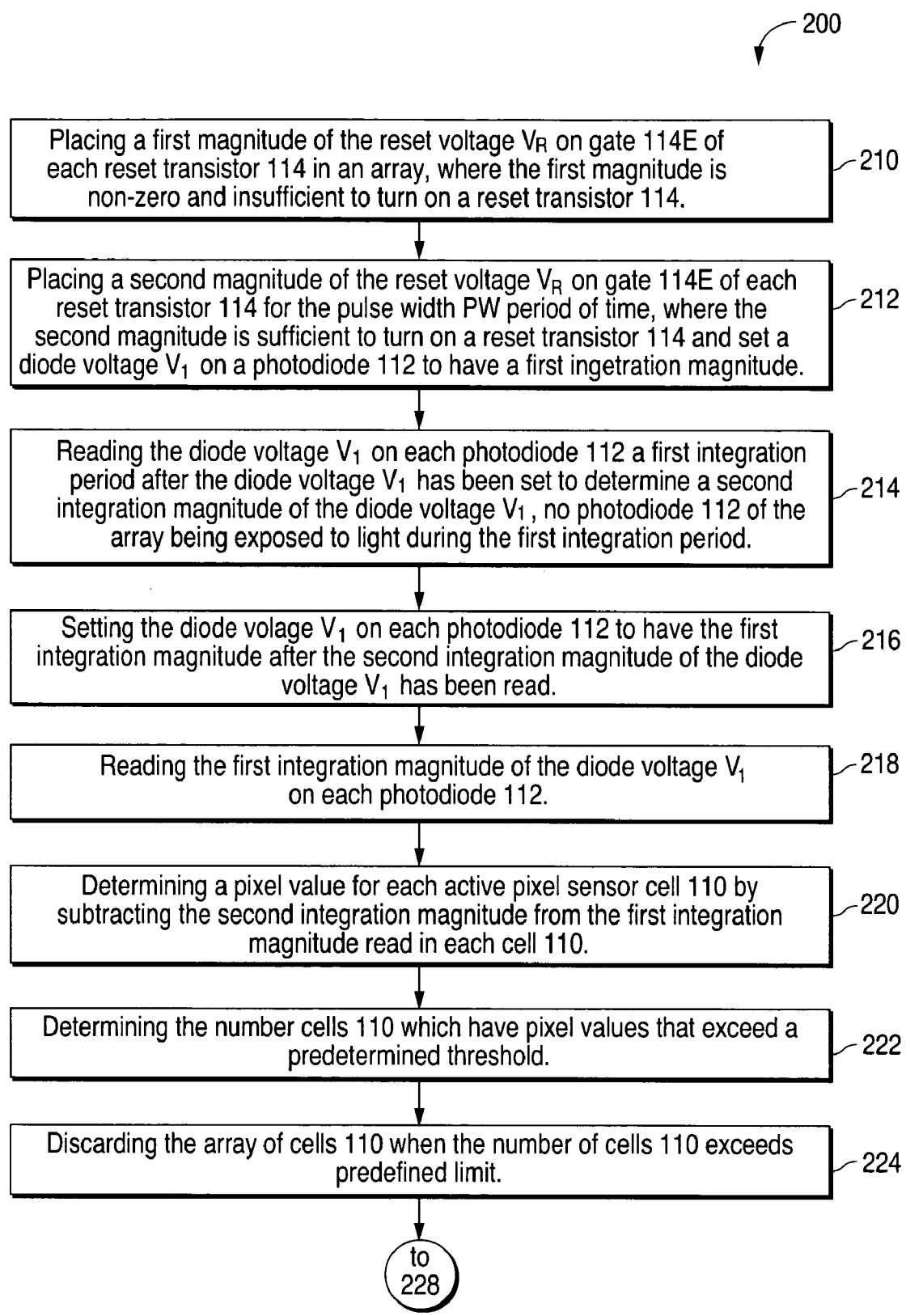
FIGS. 2A–2B are a flow chart illustrating an example of a method 200 of operating an active pixel sensor cell in accordance with the present invention.
Figure 2B:
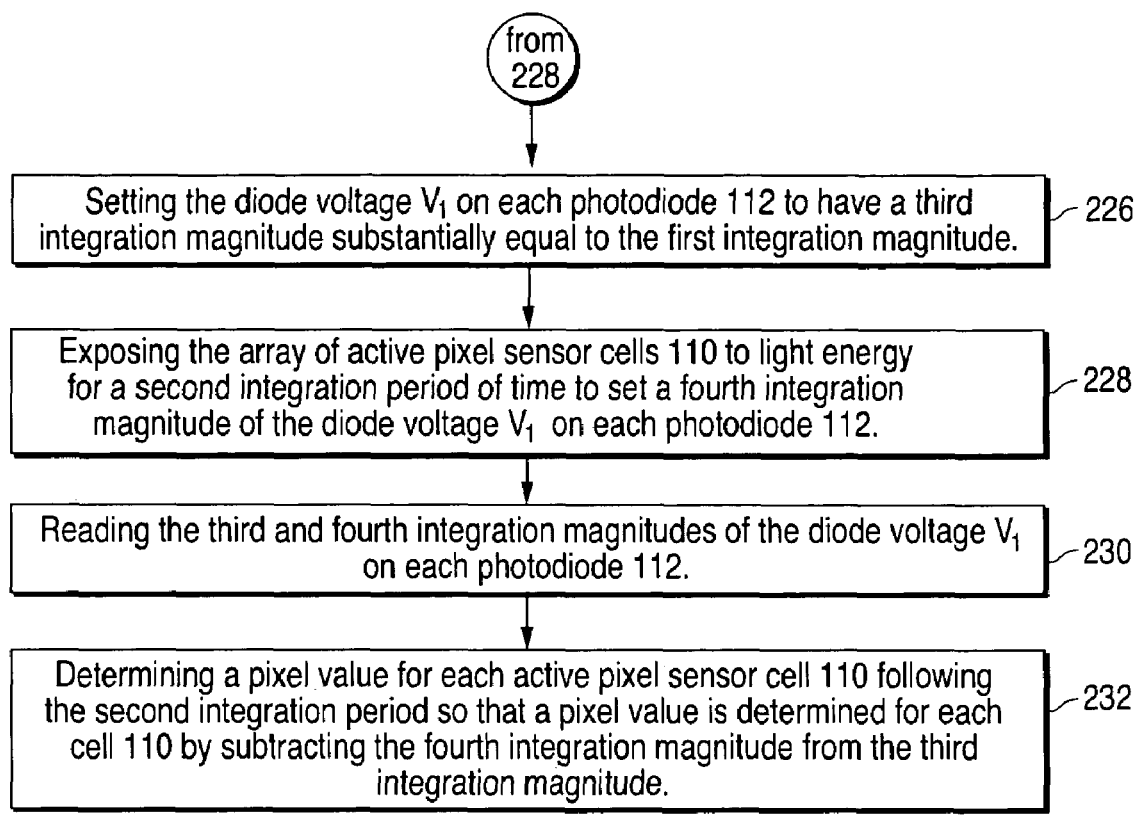

FIGS. 2A–2B show a flow chart that illustrates an example of a method 200 of operating an array of active pixel sensor cells in accordance with the present invention. As described in greater detail below, the present invention substantially reduces the source GIDL component of the dark current by setting the voltages on the gates of the reset transistors of the array to have non-zero values when the reset transistors are turned off.

Method 200 of the present invention can be practiced on an array of deep-submicron active pixel sensor cells, such as an array of active pixel sensor cells 110. As a result, method 200 of the present invention refers to the structures of imaging circuit 100 and active pixel sensor cell 110 when describing the array of method 200.

As shown in FIGS. 2A–2B, method 200 begins at step 210 by placing a reset voltage $V_R$ with a first magnitude on the gate 114E of each reset transistor 114 in the array of active pixel sensor cells 110. In accordance with the present invention, the first magnitude of the reset voltage $V_R$ is positive, but insufficient to turn on a reset transistor 114 in the array.

Following this, method 200 moves to step 212 to place a second magnitude of the reset voltage $V_R$ on the gate 114E of each reset transistor 114 in the array for a pulse width PW period of time. The second magnitude of the reset voltage $V_R$ is sufficient to turn on a reset transistor 114, and can be equal to the supply voltage VCC (or the supply voltage VCC plus the threshold voltage $V_t$ of reset transistor 114).

When turned on, each reset transistor 114 sets a first integration magnitude of a diode voltage $V_1$ on the n+ region of photodiode 112. The first integration magnitude is equal to the supply voltage VCC less the threshold voltage $V_{t114}$ of reset transistor 114 when the second magnitude of the reset voltage $V_R$ is equal to the supply voltage VCC (or the supply voltage VCC when the second magnitude is equal to the supply voltage VCC plus the threshold voltage $V_t$ of reset transistor 114).

After the diode voltage $V_1$ on the n+region of photodiode 112 has been set to the first integration magnitude, method 200 moves to step 214 to read the diode voltage $V_1$ on each photodiode 112 a first integration period after the diode voltage $V_1$ has been set to determine a second integration magnitude of the diode voltage $V_1$. In accordance with the present invention, no photodiode 112 of the array is exposed to light during the first integration period.

The second integration magnitude of the diode voltage $V_1$, which is the post integration magnitude of the diode voltage $V_1$, is read by turning on select transistor 118. When select transistor 118 turns on, the value of the diode voltage $V_1$ on the n+ region of photodiode 112, which has been reduced by the dark current during the first integration period, reduces the magnitude of a second voltage $V_2$ on the source of source-follower transistor 116 which, in turn, reduces the magnitude of a third voltage $V_3$ on the source of select transistor 118. The reduced voltage level on the source of select transistor 118 is then detected by conventional voltage detectors. The second integration magnitude of the diode voltage $V_1$ is equal to $VCC-V_{T114}-V_{DC}$, where $V_{DC}$ represents the change in voltage due to the dark current.

After the second integration magnitude of the diode voltage $V_1$ has been read, method 200 moves to step 216 to again place the second magnitude of the reset voltage $V_R$ on the gate 114E of each reset transistor 114 in the array for the pulse width PW period of time. When reset transistor 114 is turned on, transistor 114 again sets the diode voltage $V_1$ on the n+ region of photodiode 112 to have the first integration magnitude. Ideally, the first integration magnitude of the diode voltage $V_1$ set at step 216 is identical to the first integration magnitude set at step 210, i.e., equal to the supply voltage VCC or the supply voltage VCC less the threshold voltage $V_t$ of reset transistor 114.

Next, method 200 moves to step 218 to read the first integration magnitude of the diode voltage $V_1$ from each cell 110. The first integration magnitude of the diode voltage $V_1$ is read by again turning on row select transistor 118. When row select transistor 118 is turned on, the first integration magnitude of the diode voltage $V_1$ on the n+ region of photodiode 112 sets the magnitude of the second voltage $V_2$ on the source of source-follower transistor 116 which, in turn, sets the magnitude of the third voltage $V_3$ on the source of select transistor 118. The magnitude of the third voltage $V_3$ is then detected by conventional voltage detectors.

Following this, method 200 moves to step 220 to determine a pixel value, which represents the magnitude of the dark current collected by each photodiode 112 during the first integration period, for each active pixel sensor cell 110. As noted above, the source GIDL component is a significant part of the dark current. The pixel value for each cell is determined by subtracting the second integration magnitude read at the end of the first integration period from the first integration magnitude read following the second reset.

Once a pixel value for each cell 110 in the array has been determined, method 200 moves to step 222 to determine the number of cells 110 in the array which have a pixel value that exceeds a predetermined threshold, such as a pixel value that appears as a white dot on a black background (a star light effect). Following this, method 200 moves to step 224 to discard the array when the number of cells 110 (that appear as a white dot) exceeds a predefined limit, such as 1500 cells.

Next, method 200 moves to step 226 to set the diode voltage $V_1$ on each photodiode 112 to have a third integration magnitude that is substantially equal to the first integration magnitude in the same manner that the first integration magnitude was set. Once the third magnitude has been set, method 200 moves to step 228 to expose the array of active pixel sensor cells 110 to light energy for a second integration period of time to form a fourth integration magnitude of the diode voltage $V_1$ on each photodiode 112.

After this, method 200 moves to step 230 to read the third and fourth integration magnitudes of the diode voltage $V_1$ on each photodiode 112 in the same manner that first and second integration magnitudes are read. Following this, method 200 moves to step 232 to determine a pixel value, which represents the magnitude of the absorbed photons and the dark current collected by each photodiode 112 during the second integration period, for each active pixel sensor cell 110. The pixel value for each active pixel sensor cell 110 is determined by subtracting the fourth integration magnitude read at the end of the second integration period from the third integration magnitude read following the second reset.

Although method 200 describes determining the first and second integration magnitudes before the third and fourth integration magnitudes, the steps used to determine the third and fourth integration magnitudes can alternately be performed before the steps used to determine the first and second integration magnitudes.

As noted above, the first magnitude of the reset voltage $V_R$ is positive, but insufficient to turn on a reset transistor 114 in the array. In the present invention, the first magnitude of the reset voltage $V_R$ is preferably equal to a GIDL-reducing value which, in turn, is defined to be equal to the threshold voltage of reset transistor 114 plus a minimum gate voltage.

The minimum gate voltage, in turn, is defined to be the minimum voltage that can be applied to the gate of source-follower transistor 116 to force source-follower transistor 116 to operate in the active transistor region at the boundary between the active transistor region and the triode region while passing the bias current I that is sunk by bias circuit 120.

Thus, since the GIDL-reducing value of the first magnitude of the reset voltage $V_R$ is equal to the threshold voltage plus the voltage on the source of reset transistor 114, reset transistor 114 is turned off when the GIDL-reducing value of the first magnitude of the reset voltage $V_R$ is present. (Reset transistor 114 is turned on when the magnitude of the reset voltage $V_R$ on the gate of reset transistor 114 is greater than the threshold voltage plus the voltage on the source of reset transistor 114.)

The GIDL-reducing value of the first magnitude of the reset voltage $V_R$ can be estimated from the I–V (current-to-voltage) characteristic (see D. Johns and K. Martin, "Analog Integrated Circuit Design," John Wiley & sons, Inc., 1997), through a SPICE simulation, or by calculating a value. (A safety margin of, for example, 150 mV can be removed from the GIDL-reducing value of the first magnitude of the reset voltage $V_R$ to insure that reset transistor 114 does not turn on during an integration period.)

A calculated value can be determined by evaluating the bias condition provided by bias circuit 120. In circuit 120, the bias current I that flows through transistors 116, 118, and 122 can be described by equations EQ 2, EQ3, and EQ4 as:

$$I = \frac{\beta_{116}}{2}(V_1 - V_2 - V_{th\_116})^2 \cdot (1 + \lambda(V_{CC} - V_2)) \quad \text{EQ. 2}$$

$$= \frac{\beta_{122}}{2}(V_4 - V_{th\_122})^2 \cdot (1 + \lambda \cdot V_3) \quad \text{EQ. 3}$$

$$= \beta_{118}\left[(V_{CC} - V_3 - V_{th\_118}) \cdot (V_2 - V_3) - \frac{1}{2}(V_2 - V_3)^2\right], \quad \text{EQ. 4}$$

where $V_{th\_116}$, $V_{th\_118}$ and $V_{th\_122}$ represent the threshold voltages of source-follower transistor 116, select transistor 118, and bias transistor 122, respectively. $\beta$ and $\lambda$, in turn, are transistor related constants.

The minimum magnitude of voltage $V_3$ that is required to keep the circuitry working in the active transistor region is defined by equation EQ. 5 as:

$$V_3 = \sqrt{\frac{2I}{\beta_{122}}} . \quad \text{EQ. 5}$$

Transistor 118 is in the deep triode region. As a result, $V_2 \approx V_3$. Therefore, the minimum magnitude of voltage $V_1$ ($V_{1\_min}$) that is required to keep the circuitry working in the active transistor region can be calculated from equation EQ. 2 and equation EQ. 5 as shown in equation EQ. 6 as:

$$V_{1\_min} = \sqrt{\frac{2I}{\beta_{122}}} + V_{th\_116} + \sqrt{\frac{2I}{\beta_{116}\left(1 + \lambda\left(V_{CC} - \sqrt{\frac{2I}{\beta_{122}}}\right)\right)}} . \quad \text{EQ. 6}$$

Therefore, the the GIDL-reducing value of the first magnitude of the reset voltage ($V_{R\_opt}$) is defined by equation EQ. 7 as:

$$V_{R\_opt} = V_{1\_min} + V_{th\_114}. \quad \text{EQ. 7}$$

where $V_{th\_114}$ is the threshold voltage of reset transistor 114.

Figure 1:
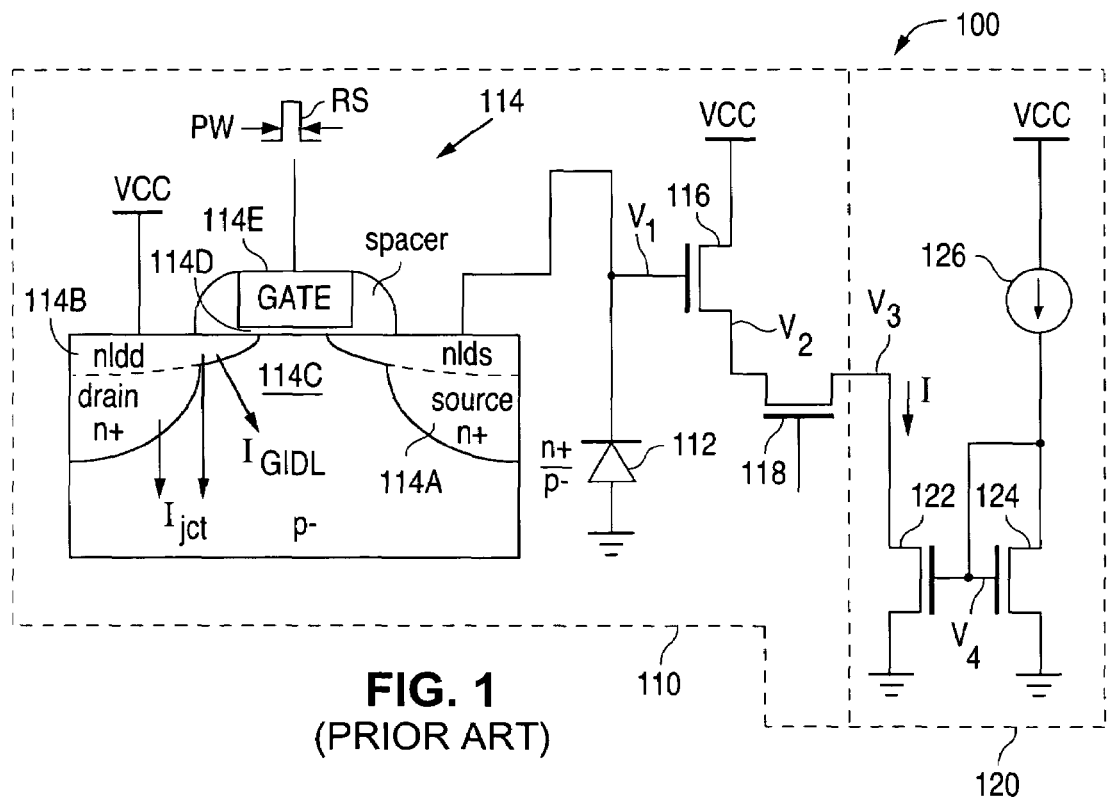
FIG. 1 is a diagram illustrating a prior-art imaging circuit 100.
Figure 3A:
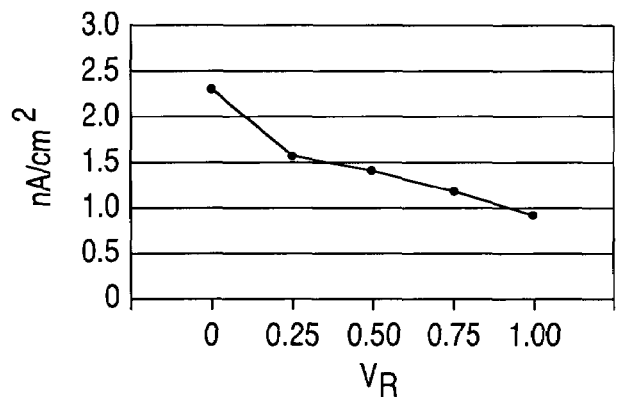
FIGS. 3A–3B are graphs illustrating the reduction in the source GIDL current component that results from setting the first magnitude of the reset voltage $V_R$ to a non-zero value that is insufficient to turn on the reset transistor in accordance with the present invention.
Figure 3B:
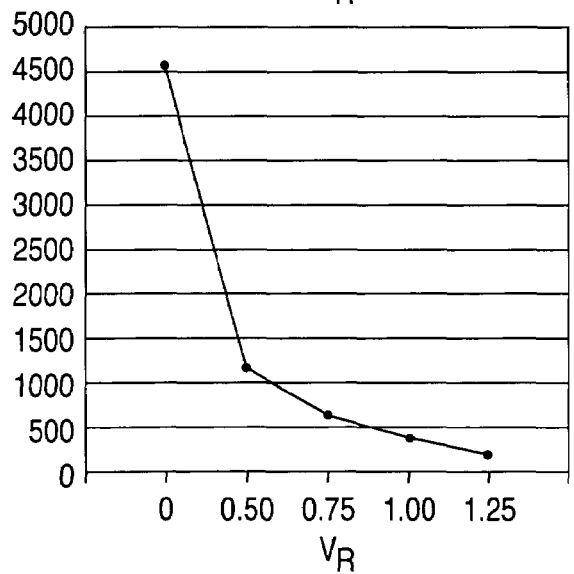

FIGS. 3A–3B show graphs that illustrate the reduction in the source GIDL current component that results from setting the first magnitude of the reset voltage $V_R$ to a positive value that is insufficient to turn on the reset transistor in accordance with the present invention. FIG. 3A shows a graph that illustrates a reset voltage $V_R$ versus a dark current density nA/cm2 of a 7.5 um three-transistor active pixel sensor cell fabricated with 0.18-micron standard CMOS process logic.

As shown in FIG. 3A, the dark current density drops significantly when the magnitude of the reset voltage $V_R$ is raised from ground to $0.25V_R$ and again drops significantly when the magnitude of the reset voltage $V_R$ is raised to 0.75V. Thus, by setting the first magnitude of the reset voltage $V_R$ to be near the GIDL-reducing voltage of reset transistor 114, the source GIDL current contribution can be substantially reduced.

As a result, the present invention provides a method of operating an array of active pixel sensor cells that significantly reduces the dark current density of the cell. One of the advantages of reducing the dark current density is that far fewer cells in an array of cells will saturate, and thereby become bad, before the end of the integration period.

FIG. 3B shows a graph that illustrates a reset voltage $V_R$ versus a number of bad cells, which are also known as bad pixels. As shown in FIG. 3B, the number of bad pixels in an array drops dramatically when the magnitude of the reset voltage $V_R$ is raised from ground to 0.50V, and again drops significantly when the magnitude of the reset voltage $V_R$ is raised to 0.75V.

Thus, for example, with a 0.18-micron NMOS reset transistor, by raising the first magnitude of reset voltage $V_R$ from ground to 0.5V, both the dark current density of a cell and the number of cells in an array of cells that saturate before the end of the integration period can be substantially reduced, while at the same time safely insuring that reset transistor 114 remains off during the integration period.

One advantage of the present invention is that an array of active pixel sensor cells can be fabricated such that the first magnitude of the reset voltage $V_R$ is placed on the gate 114E of each reset transistor 114 when transistor 114 is turned off, and method 200 can be used to test the fabricated array to determine the number of bad pixels that are present due to the dark current which, as noted above, has a significant source GIDL component in deep submicron circuits.

The bad pixels are saturated cells and can show up as white dots on a black background (the star light effect). If the number of bad pixels (white dots) is less than a predefined limit, such as 1500 cells, the array passes the test. On the other hand, if the number of bad pixels is greater than the predefined limit, the array fails the test and is discarded.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of operating a plurality of imaging cells, each imaging cell including:

a reset transistor having a gate; and a photodiode connected to the reset transistor, the method comprising the steps of:

placing a first magnitude of a reset voltage on the gate of each reset transistor of the plurality of imaging cells, the first magnitude being non-zero and insufficient to turn on the reset transistor;

placing a second magnitude of the reset voltage on the gate of each reset transistor of the plurality of imaging cells for a pulse width period of time, the second magnitude being sufficient to turn on a reset transistor and set a diode voltage on a photodiode to have a first integration magnitude;

reading the diode voltage on each photodiode a first integration period after the diode voltage has been set to determine a second integration magnitude of the diode voltage;

reading the first integration magnitude of the diode voltage on each photodiode;

determining a plurality of pixel values for the plurality of imaging cells so that a pixel value is determined for each imaging cell by subtracting the second integration magnitude from the first integration magnitude read;

wherein the plurality of imaging cells are exposed to no light during the first integration period; and determining a number of cells which have pixel values that exceed a predetermined threshold.

2. The method of claim 1 wherein the plurality of imaging cells are discarded when the number of cells exceeds a predefined limit.

3. The method of claim 2 wherein each imaging cell further includes:

a source-follower transistor connected to the photodiode and reset transistor;

a select transistor connected to the source-follower transistor; and a sense node connected to the select transistor, a bias current flowing through the source-follower and sense transistors to the sense node.

4. The method of claim 3 wherein the first magnitude of the reset voltage is equal to a sum of a threshold voltage of the reset transistor and a minimum voltage of the source-follower transistor, the minimum voltage being equal to a voltage required to operate the source-follower transistor in an active transistor region at a boundary between the active transistor region and a triode region while passing the bias current.

5. The method of claim 3 wherein the first magnitude of the reset voltage is equal to a sum of a threshold voltage of the reset transistor and a minimum voltage of the source-follower transistor less a fixed safety margin, the minimum voltage being equal to a voltage required to operate the source-follower transistor in an active transistor region at a boundary between the active transistor region and a triode region while passing the bias current.

6. The method of claim 2 and further comprising the step of setting the diode voltage on each photodiode to have the first integration magnitude after the second integration magnitude of the diode voltage has been read, wherein the first integration magnitude of the diode voltage is read after the second integration magnitude of the diode voltage has been read.

7. The method of claim 1 and further comprising the steps of:

setting the diode voltage on each photodiode to have a third integration magnitude substantially equal to the first integration magnitude;

exposing the plurality of imaging cells to light energy for a second integration period of time to form a fourth integration magnitude of the diode voltage on each photodiode;

reading the third and fourth integration magnitudes of the diode voltage on each photodiode; and determining a plurality of pixel values for the plurality of imaging cells following the second integration period so that a pixel value is determined for each imaging cell by subtracting the fourth integration magnitude from the third integration magnitude.

8. The method of claim 7 wherein the first and second magnitudes are formed before the third and fourth magnitudes.

9. The method of claim 7 wherein the first and second magnitudes are formed after the third and fourth magnitudes.

10. The method of claim 7 and further comprising the step of determining a number of cells which have pixel values that exceed a predetermined threshold.

11. The method of claim 10 wherein the plurality of imaging cells are discarded when the number of cells exceeds a predefined limit.

12. The method of claim 11 wherein each imaging cell further includes:

a source-follower transistor connected to the photodiode and reset transistor;

a select transistor connected to the source-follower transistor; and a sense node connected to the select transistor, a bias current flowing through the source-follower and sense transistors to the sense node.

13. The method of claim 12 wherein the first magnitude of the reset voltage is equal to a sum of a threshold voltage of the reset transistor and a minimum voltage of the source-follower transistor, the minimum voltage being equal to a voltage required to operate the source-follower transistor in an active transistor region at a boundary between the active transistor region and a triode region while passing the bias current.

14. The method of claim 12 wherein the first magnitude of the reset voltage is equal to a sum of a threshold voltage of the reset transistor and a minimum voltage of the source-follower transistor less a fixed safety margin, the minimum voltage being equal to a voltage required to operate the source-follower transistor in an active transistor region at a boundary between the active transistor region and a triode region while passing the bias current.

15. The method of claim 12 and further comprising the step of setting the diode voltage on each photodiode to have the third magnitude after the fourth magnitude has been read, wherein the third magnitude of the diode voltage is read after the fourth magnitude has been read.

16. The method of claim 12 wherein the second magnitude of the reset voltage is equal to a supply voltage.

17. The method of claim 12 wherein the second magnitude of the reset voltage is equal to a supply voltage plus a threshold voltage of the reset transistor.

* * * * *